(12) United States Patent
Mina et al.

(10) Patent No.: US 8,611,158 B2
(45) Date of Patent: Dec. 17, 2013

(54) SYSTEMS AND METHODS FOR ERASING CHARGE-TRAP FLASH MEMORY

(75) Inventors: Diego Della Mina, Colle Brianza (IT); Chiara Missiroli, Concorezzo (IT); Osama Khouri, Bellano (IT)

(73) Assignee: Elpida Memory, Inc., Tokyo (JP)

( * ) Notice: Subject to any disclaimer, the term of this patent is extended or adjusted under 35 U.S.C. 154(b) by 140 days.

(21) Appl. No.: 13/220,883

(22) Filed: Aug. 30, 2011

(65) Prior Publication Data
US 2013/0051156 A1 Feb. 28, 2013

(51) Int. Cl.
*G11C 16/14* (2006.01)
*G11C 16/16* (2006.01)
*G11C 16/06* (2006.01)

(52) U.S. Cl.
USPC .......... 365/185.29; 365/185.02; 365/185.17; 365/185.18; 365/185.33

(58) Field of Classification Search
USPC ............ 365/185.02, 185.17, 185.18, 185.29, 365/185.33
See application file for complete search history.

(56) References Cited

U.S. PATENT DOCUMENTS

| | | | | |
|---|---|---|---|---|
| 5,589,699 | A * | 12/1996 | Araki | 257/316 |
| 5,793,677 | A * | 8/1998 | Hu et al. | 365/185.17 |
| 5,815,438 | A * | 9/1998 | Haddad et al. | 365/185.17 |
| 7,649,777 | B2 * | 1/2010 | Ichige et al. | 365/185.17 |
| 7,924,622 | B2 | 4/2011 | Lee et al. | |
| 2005/0180213 | A1 * | 8/2005 | Abe et al. | 365/185.17 |
| 2010/0128522 | A1 * | 5/2010 | Choi et al. | 365/185.2 |

* cited by examiner

*Primary Examiner* — J. H. Hur
(74) *Attorney, Agent, or Firm* — Morrison & Foerster LLP

(57) ABSTRACT

FLASH memory device contains at least one memory stack. The stack of transistors includes a first (or source) selector transistor, a second (or drain) selector transistor, and a plurality memory cell transistors connected in series therebetween. During an erase operation, each of the first and second selector transistors has a bias applied that releases the select transistors from an electrically floating state together with biasing each of the memory cell transistors.

20 Claims, 6 Drawing Sheets

SYSTEMS AND METHODS FOR ERASING CHARGE-TRAP FLASH MEMORY

FIELD

The present disclosure is generally directed to the field of electronic memory devices, and more particularly to an erase operation for NAND memory devises as nonvolatile memory devices.

BACKGROUND

The decrease in cost of nonvolatile memory devices has contributed to a recent explosion in demand for portable electronic devices. Although electronically-erasable nonvolatile memory (hereinafter "FLASH memory") has been commercially available, recent advances in memory cell and transistor technology have allowed for a proliferation of consumer devices that store large amounts of information, such as high-resolution digital cameras, portable digital video recorders, and personal music players, which can store large amounts of pictures, videos, and songs, respectively.

Two types of FLASH memory have emerged in response to this demand: "NOR" technology, which employs a parallel memory cell architecture, and "NAND" technology, which employs a serial memory cell architecture. Each type of FLASH memory is well-suited to certain consumer applications. For example, NAND technology may be beneficial where storage density and cost are important considerations, such as music and video storage applications. By contrast, NOR technology may be beneficial where access time is an important consideration, such as software storage and execution.

Memory capacity in nonvolatile memory devices in general, and NAND memory devices in particular, has increased along with consumer demand for ever-increasing amounts of storage in portable electronic devices. Demand for increased memory capacity has led to greater memory array densities and different memory architectures. Yet, as memory array densities continue to increase, parasitic effects have emerged, which tend to limit further increases in memory array densities and limit application of different memory architectures to meet consumer demand. Parasitic effects can lead to an inability to correctly read stored data from the FLASH memory, as discussed below.

Figure 1A:
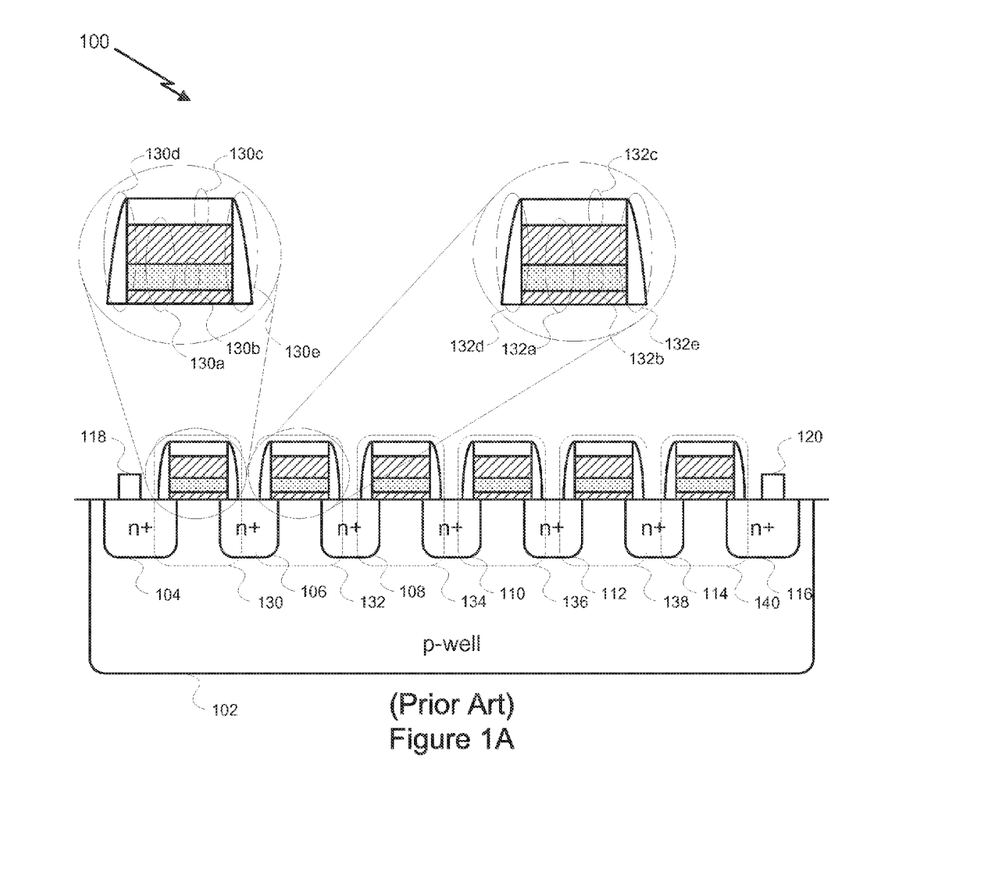
FIG. 1A illustrates a cross-sectional view of a conventional stack of memory cells.

FIG. 1A illustrates a cross-sectional view of a conventional stack of memory cells 100. This stack 100 is depicted as a NAND stack of Charge-Trapping type ("CT-NAND" stack) in which charges are trapped into a gate insulating film. As illustrated, stack 100 comprises a series of transistors with shared diffusion regions present in p-well 102, including diffusion regions 104, 106, 108, 110, 112, 114, and 116. These shared diffusion regions contribute to formation of memory cells 132, 134, 136, and 138, as well as formation of source selector 130 and drain selector 140. Drain 116 is coupled to a global bitline by drain contact 120 and source 104 is coupled to a shared source line by source contact 118. Additionally, as illustrated, each transistor in FIG. 1 comprises a gate, a gate oxide further comprising a charge-trap region, and isolation oxides on the left and right sides of the gate oxide (in this cross-sectional view). As illustrated, for example, source selector 130 comprises gate oxide 130a further comprising charge-trap region 130b, gate 130c, isolation oxide 130d, and isolation oxide 130e, and memory cell 132 comprises gate oxide 132a further comprising charge-trap region 132b, gate 132c, isolation oxide 132d, and isolation oxide 132e.

Figure 1B:
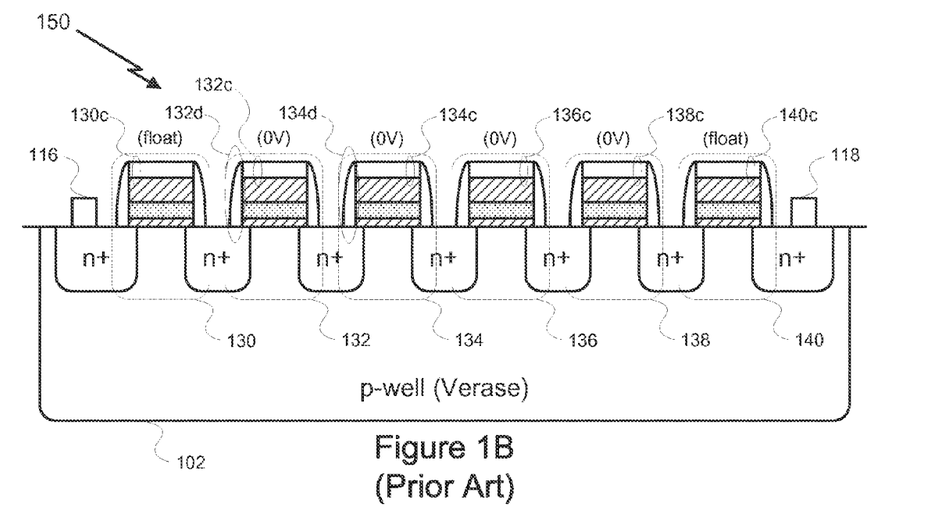
FIG. 1B illustrates a biasing configuration for a stack of memory cells during a conventional erase operation.

FIG. 1B illustrates a biasing configuration for a stack of memory cells 150 during a conventional erase operation. During a conventional erase operation, the gates of memory cells within the stack are biased at ground and p-well 102 is biased at a high voltage, thereby creating a voltage differential across the oxide of the memory cells that is large enough to tunnel stored electrons from the charge-trap regions within the memory cells to p-well 102. As illustrated in FIG. 1B, gates 132c, 134c, 136c, and 138c are biased to ground (0 Volt) during a conventional erase operation, while p-well 102 is biased to $V_{erase}$. Additionally, during a conventional erase operation, source selector 130 and drain selector 140 are configured with their gates in floating states. As illustrated in FIG. 1B, the gates of selectors 130 and 140 are electrically floating. The floating states of gates of the selectors can lead to those gates capacitively coupling to the high voltage bias on p-well 102. Thus, the bias on the gates of selectors 130 and 140 may be substantially similar to $V_{erase}$ during an erase operation.

Another type of NAND memory device, i.e., a floating gate type, is well known in the art. This type of NAND memory device is called "FG-NAND," in contrast to CT-NAND. In FG-NAND memory devices, memory cells in a NAND stack include a floating gate and a control gate provided over the floating gate, and each of source and drain selectors sandwiching a plurality of memory cells therebetween is constructed to operate as a single gate transistor by short-circuiting the floating and control gates to each other. U.S. Pat. No. 7,924,622 B2 discloses an erase operation for such FG-NAND memory devices.

The inventors of the present invention recognize that in CT-NAND memory devices, parasitic effects can arise from these biasing conditions, because voltage differentials between gates of the selectors and gates of memory cells adjacent to the selectors can be sufficient to tunnel electrons into isolation oxides associated with memory cells adjacent to the selectors. Referring again to FIG. 1B, for example, the floating state of gate 130c, which may lead to a bias of $V_{erase}$ on gate 130c, and the grounding of gate 132c within memory cell 132, may lead to a voltage differential of $V_{erase}$ between gate 130c and gate 132c. This voltage differential may be sufficient to tunnel electrons into isolation oxide 132d.

If electrons tunnel into an isolation oxide, such as isolation oxide 132d, they may become trapped. If electrons become trapped in sufficient number within an isolation oxide, those trapped electrons can interact with the electric field that exists within a memory cell during a read operation by reducing or eliminating that electric field. Therefore, electron trapping in an isolation oxide of a memory cell, such as electron trapping in isolation oxide 132d of memory cell 132 (near selector 130), can have the effect of raising the threshold voltage of that memory cell (such as memory cell 132 in this example). In sufficient quantity, electron trapping in an isolation oxide can have the detrimental effect of reducing or eliminating channel formation and thus reducing or eliminating conduction within a memory cell during a read operation. Such changes to the conduction of a memory cell within a stack of memory cells can lead to the effected memory cell incorrectly being read as a programmed memory cell rather than an erased memory cell. Thus, these parasitic effects can lead to an inability to correctly read data within the FLASH memory device.

Additionally, unlike a conventional erase operation occurring in a memory cell rather than a selector, this accumulation of electrons in an isolation oxide is irreversible; i.e., the accumulation of electrons cannot be offset by an erase operation. This inability to reverse electron trapping in isolation oxides, such as isolation oxide 132d of memory cell 132, is due to the electrons in the isolation oxide being introduced by an erase operation. Thus, the means for removing electrons from a location where they are trapped—normally an erase operation—could only tend to increase the number of electrons trapped in the isolation oxide. Accordingly, accumulation of electrons in an isolation oxide, such as isolation oxide 132d, may be permanently detrimental to operation of a FLASH memory device because removal of the trapped electrons may not be possible once they have accumulated. This condition represents a serious parasitic effect that designers of modern NAND FLASH memory devices have faced.

Accordingly, a need exists for methods that reduce or avoid the parasitic effects noted above, while allowing further improvements in memory array density and alternative geometries for NAND FLASH memory devices.

SUMMARY

According to one aspect of the disclosure, a method is provided for performing an erase operation on a memory stack that includes first and second selector transistors and a plurality of memory cell transistors connected in series between the first and second selector transistors, the memory cell transistors including a first memory transistor adjacent to the first selector transistor and a second memory cell transistor adjacent to the second selector transistor, the performing the erase operation comprising: applying a bias voltage to a gate of each of the first and second selector transistors to release the gate of each of the first and second selector transistors from an electrically floating condition; and applying an erase voltage to a gate of each of the first and second memory transistors.

It may be convenient to differentiate the bias voltage from the erase voltage. More preferably, the bias voltage may be greater than the erase voltage.

In another aspect of the disclosure, such a method is provided that comprises applying first, second and third voltages to a NAND memory stack, the NAND memory stack comprising first and second selector transistors and a plurality of memory cell transistors that are formed in a semiconductor region, the memory cell transistors being between the first and second selector transistors and including a first memory cell transistor located on a side of the first selector transistor and a second memory cell transistor located on a side of the second selector transistor, applying the first voltage to the semiconductor region; applying the second voltage to a gate of each of the first and second selector transistors to release the gate of each of the first and second selector transistors from an electrically floating condition; and applying the third voltage to a gate of the first and second memory transistors, wherein a potential difference between the first and second voltages is less than a potential difference between the first and third voltages In still another aspect of the disclosure, a method comprises performing an erase operation on a NAND memory stack, the NAND memory stack including first and second selector transistors and a plurality of memory cell transistors being between the first and second selector transistors, each of the first and second selector transistors and the memory transistors being substantially similar in gate structure, the performing the erase operation comprising a sequence of first and second operations; the first operation comprising applying a set of voltages to the NAND memory stack; and the second operation comprises programming each of the first and second selector transistors.

BRIEF DESCRIPTION OF THE DRAWINGS

The accompanying drawings, which are incorporated in and constitute a part of this specification, illustrate several embodiments and, together with the description, serve to explain the disclosed principles. In the drawings.

DESCRIPTION OF THE EMBODIMENTS

Disclosed embodiments include methods for reducing or avoiding parasitic effects in NAND FLASH memory devices while increasing memory array density.

Embodiments disclosed herein utilize several approaches to biasing memory cells and selectors within a charge-trap NAND (or CT-NAND) FLASH memory device during an erase operation to reduce electric field strength in certain regions of the device, thereby reducing or avoiding parasitic effects. Disclosed embodiments also achieve benefits by managing the threshold voltage of drain and source selectors within a memory array. According to the disclosed embodiments, the memory cells within a CT-NAND FLASH memory device can be reliably read, erased, and programmed while achieving memory array densities that were previously precluded by parasitic effects.

Figure 2:
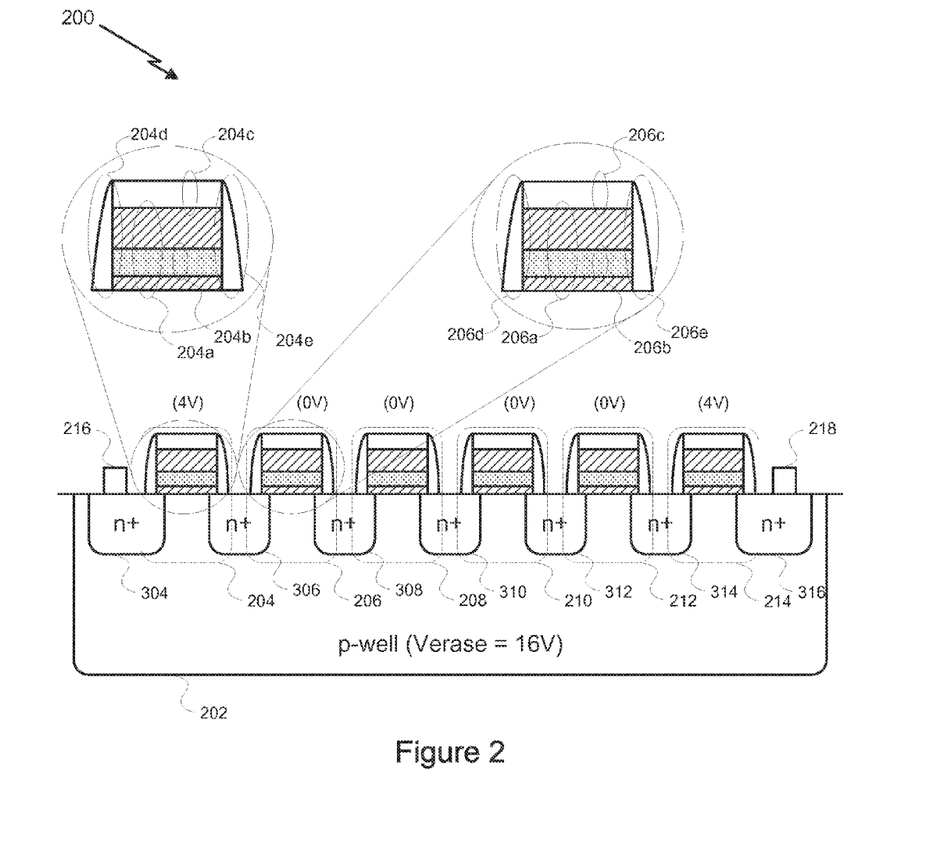
FIG. 2 illustrates a biasing configuration for a stack of memory cells during an erase operation on a selected block of memory according to an embodiment that reduces or eliminates parasitic effects.

FIG. 2 illustrates a biasing configuration for a stack of memory cells 200 during an erase operation on a selected block of memory according to an embodiment that reduces or eliminates parasitic effects. As illustrated, CT-NAND stack 200 comprises a series of transistors with shared diffusion regions formed in a semiconductor (silicon, for example) region 202. In this embodiment, the region 202 is formed as p-type well, and each of the diffusion regions 304, 306, 308, 310, 312, 314, and 316 is of an n-type. These shared diffusion regions contribute to formation of memory cells (or memory cell transistors) 206, 208, 210, and 212, as well as formation of source selector (or source selector transistor) 204 and drain selector (or drain selector transistor) 214. Drain 316 is coupled to a global bitline (not shown) by drain contact 218 and source 304 is coupled to a shared source line by source contact 216. Although not shown, a dummy transistor may be provided between source selector 204 and memory cell 206 and between drain selector 214 and memory cell 212. As illustrated, each transistor in FIG. 2 comprises a gate electrode, a gate insulating film comprising a charge-trap region, and a sidewall insulating film on each of the left and right sides of the gate insulating film (in this cross-sectional view). As illustrated, for example, source selector 204 comprises, similarly to drain selector, gate insulating film 204a, gate electrode 204c, sidewall insulating films 204d and 204e, and memory cell 206 comprises, similarly to the other memory cells, gate insulating film 206a, gate electrode 206c, sidewall insulating films 206d and 206e. In this embodiment, further, each of the gate insulating films 204a and 206a comprises three insulating layers such as silicon oxide layer (SiO), silicon nitride layer (SiN) and a silicon oxi-nitride layer (SiON) stacked with one another in that order on the p-well 202. The SiN layer thus serves as a charge-trap region as indicated by the reference numeral 204b or 206b to trap charges therein and/or at boundaries between SiN and SiO layers and/or SiN and SiON layers. Thus, each of source and drain selectors is the same in structure as each of memory cells.

In this embodiment, during an erase operation on the stack of memory cells 200, the gates of selectors 204 and 214 are biased at a first positive voltage and the gates of memory cells 206, 208, 210, 212 are biased at ground. Additionally, the p-well 202 is biased at a high voltage. In this embodiment, the gates of selectors and memory cells in unselected memory blocks each including stacks of selectors and memory cells to be released from erasing are configured in electrically floating states.

For example, as illustrated in FIG. 2, the gates of selectors 204 and 214 (gates 204c and 214c, respectively) are biased to a first positive voltage (e.g., 4V as shown in FIG. 2). Additionally, the gates of memory cells 206, 208, 210, and 212 (gates 206c, 208c, 210c, and 212c, respectively) are biased to ground (i.e., 0V as shown in FIG. 2). Also, p-well 202 is biased to $V_{erase}$ (e.g., 16V as shown in FIG. 2).

This biasing configuration creates a voltage differential between the gates of the selectors 204 and 214 and the gates of memory cells 206 and 212 adjacent to the selectors that tends to reduce or eliminate some parasitic effects while still causing erase tunneling in memory cells. For example, the voltage differentials across the gate insulating films 206a and so on of the memory cells 206, 208, 210 and 212 may be large enough to cause erase tunneling in those memory cells so that each of memory cells is shifted from a programmed state to an erased state. The threshold voltages of each memory cell is thus changed from high level (programmed level) to low level (erased level). On the other hand, each of the voltage differentials between the gates of selectors 204 and 214 and the gates of memory cells 206 and 212 adjacent to the selectors is 4 (four) Volts and thus may substantially avoid electron tunneling into sidewall insulating films between selectors and memory cells adjacent to the selectors in the stack. Accordingly, all memory cells in the stack of memory cells 400 become erased while reducing or eliminating parasitic effects.

The voltage differential between the gates of the selectors 204 and 214 and the p-well 202 may lead to enough electron tunneling in the selectors to make their threshold voltages unacceptably low positive values, e.g., zero volts, or negative voltages. This condition can lead to an inability to correctly read data in the memory device, which will be discussed in more detail later.

Figure 3:
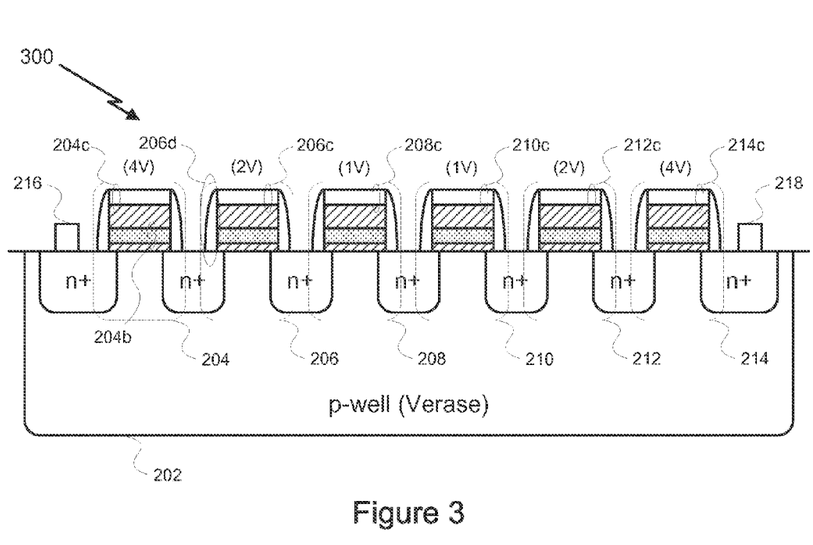
FIG. 3 illustrates another biasing configuration for a stack of memory cells during an erase operation on a selected block of memory according to another embodiment that reduces or eliminates parasitic effects.

FIG. 3 illustrates a biasing configuration for a stack of memory cells 300 during an erase operation on a selected block of memory according to another embodiment that reduces or eliminates parasitic effects, in which the same constituents as those shown in FIG. 2 are denoted by the same reference numerals to omit further descriptions thereof. Consistent with an embodiment, during an erase operation on the stack of memory cells, the gates of selectors 204 and 214 are biased at a first positive voltage, the gates of memory cells 206 and 212 adjacent to the selectors are biased at a second positive voltage, and the gates of the remaining memory cells 208 and 210 adjacent to the memory cells adjacent to the selectors are biased at a third positive voltage. Additionally, the gates of remaining memory cells (not shown in FIG. 3) between the memory cells 208 and 210 are biased at ground. Further, the p-well 202 is biased at a high voltage. In some embodiments, the first positive voltage may be more positive than the second positive voltage. Additionally, in some embodiments, the second positive voltage may be more positive than the third positive voltage.

The biasing configuration shown in FIG. 3 creates a series of voltage differentials that tend to reduce or eliminate parasitic effects while still causing erase tunneling in memory cells. For example, the voltage differentials across the gate oxides of certain memory cells may be large enough to cause erase tunneling in those memory cells but the voltage differentials between gates of transistors in the stack may substantially avoid electron tunneling into isolation oxides of transistors in the stack while biasing configuration 500 is applied. Accordingly, all memory cells in the stack of memory cells become erased while reducing or eliminating parasitic effects. In this embodiment, the gates of selectors and memory cells in unselected memory blocks are configured in electrically floating states.

For example, as illustrated in FIG. 3, the gates of source selector 204 and drain selector 214 (gates 204c and 214c, respectively) are biased to a first positive voltage (e.g., 4V as shown in FIG. 3). Additionally, memory cells 206 and 212 are adjacent to selectors 204 and 214, so the gates of memory cells 206 and 212 (gates 206c and 212c, respectively) are biased to a second positive voltage (e.g., 2V as shown in FIG. 3). Also, memory cells 208 and 210 are adjacent to the memory cells adjacent to the selectors 204 and 214, so the gates of memory cells 208 and 210 (gates 208c and 210c, respectively) are biased to a third positive voltage (e.g., 1V as shown in FIG. 3). If the stack of memory cells illustrated in FIG. 3 comprises more than four memory cells, the gates of memory cells other than the memory cells adjacent to the selectors and adjacent to the memory cells that are adjacent to the selectors (not illustrated in FIG. 3) would be biased at ground. Also, p-well 202 is biased to $V_{erase}$ that is 16V.

Consistent with an embodiment, the second positive voltage may be less positive than the first positive voltage and the third positive voltage may be less positive than the second positive voltage. For example, as shown in FIG. 3, the second positive voltage may be about 2V while the first positive voltage may be about 4V. Additionally, as shown in FIG. 3, the third positive voltage may be about 1V while the second positive voltage may be about 2V. Consistent with an embodiment, other first, second, and third positive voltages may be applied, including a third positive voltage that is greater than about 1 Volt or less than about 1 Volt, a second positive voltage that is greater than about 2 Volts or less than about 2 Volts, or a first positive voltage that is greater than about 4 Volts or less than about 4 Volts, as long as the second positive voltage is less positive that the first positive voltage and the third positive voltage is less positive than the second positive voltage.

These combinations of first, second, and third positive voltages reduce the lateral electric field between gates of the selectors and gates of the memory cells adjacent to the selectors, as well as reducing the lateral electric fields between gates of the memory cells adjacent to the selectors and gates of the memory cells adjacent to the memory cells adjacent to the selectors. Thus, a first tunneling of electrons in the sidewall insulating films between the selectors and memory cells adjacent to the selectors is substantially avoided through application of the first positive voltage and the second positive voltage. To the extent that the second positive voltage could lead to a second tunneling of electrons in the sidewall insulating films between the memory cells adjacent to the selectors and the memory cells adjacent to the memory cells adjacent to the selectors, the second tunneling of electrons is substantially avoided through use of the third positive voltage. Accordingly, all memory cells in the stack of memory cells become erased while reducing or eliminating parasitic effects. This reduction in or elimination of parasitic effects can allow for control of the threshold voltage of memory cells independent of the corresponding cells' use as memory elements or dummy cells. Additionally, cycling endurance of the memory device may improve.

Also in the embodiment shown in FIG. 3, the voltage differential between the gates of the selectors 204 and 214 and the p-well 202 may lead to enough electron tunneling in the selectors to make their threshold voltages unacceptably low positive values, e.g., zero Volts, or negative voltages. This condition can lead to an inability to correctly read data in the memory device, which will be discussed in more detail later.

Figure 4:
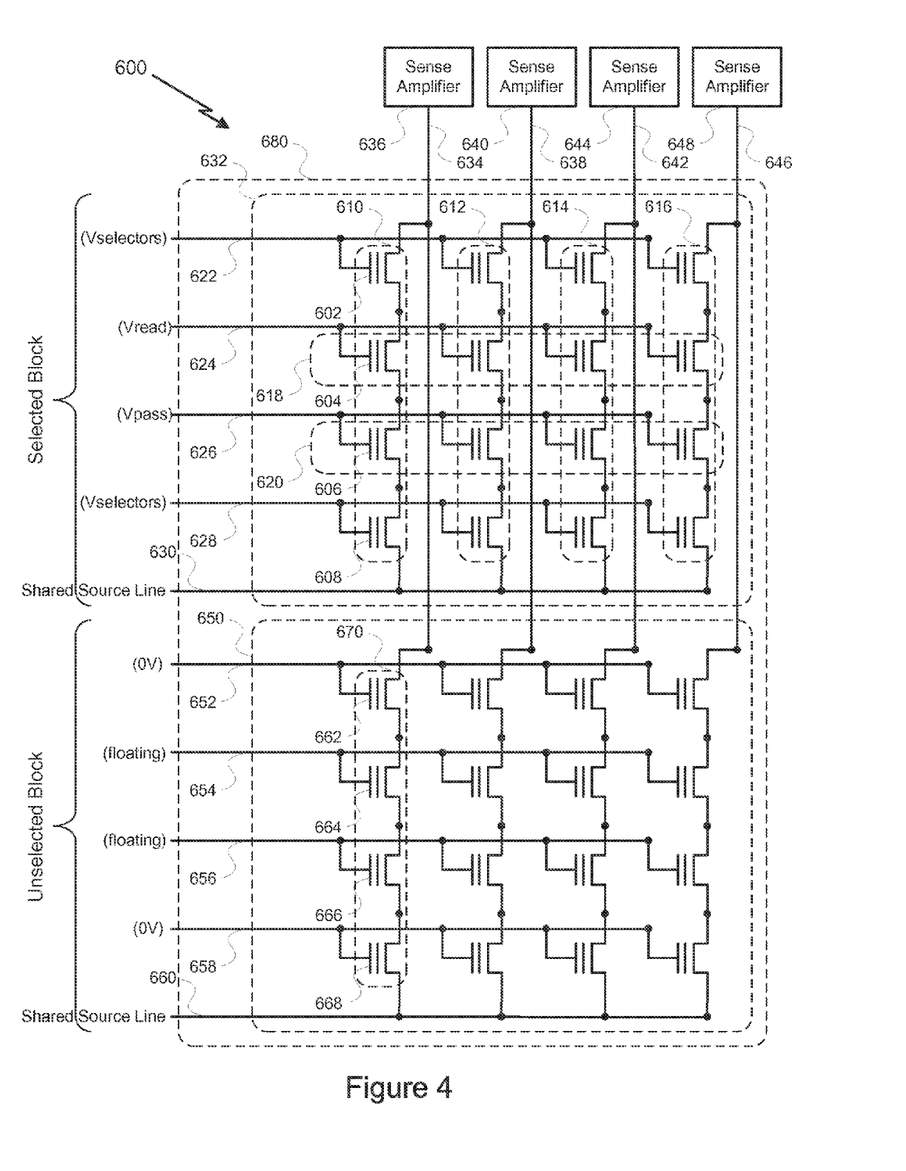
FIG. 4 illustrates a biasing configuration for a memory array during a read operation on an array comprising at least two selectors with negative threshold voltages according to an embodiment.

FIG. 4 illustrates a biasing configuration 600 for a memory array 680 during a read operation on an array comprising at least two selectors according to an embodiment. As shown, a memory array comprises a plurality of memory blocks. In an embodiment, memory blocks represent the portion of a memory array that is selected and accessed during a user operation, such as read, program, or erase. In this embodiment shown in FIG. 4, memory array 680 comprises memory blocks 632 and 650. In other embodiments, memory array 680 may comprise more than two memory blocks. As shown, each memory block comprises a plurality of memory stacks. In this embodiment, memory block 632 comprises memory stacks 610, 612, 614, and 616. In other embodiments, memory block 632 may comprise additional memory stacks or fewer memory stacks. As previously discussed, each memory stack comprises a plurality of memory cells, a source selector, and a drain selector. In this embodiment, memory stack 610 comprises memory cells 604 and 606, source selector 608, and drain selector 602. Memory stack 670 comprises memory cells 664 and 666, source selector 668, and drain selector 662. In other embodiments, memory stacks 610 and 670 may comprise additional or fewer memory cells. As shown, memory blocks also comprise a plurality of memory pages. In an embodiment, memory block 632 comprises memory page 618 and 620. In other embodiments, memory block 632 may comprise additional or fewer memory pages.

Consistent with an embodiment, the gates of the memory cells within a memory page are coupled together, forming a first coupling, sometimes referred to as a "wordline." Additionally, the gates of the source selectors within a memory block are coupled together, forming a second coupling, sometimes referred to as a "SSG." Also, the gates for the drain selectors within a memory block are coupled together, forming a third coupling, sometimes referred to as a "SDG." In this embodiment, the gates of selectors in unselected memory 650 blocks are grounded and the gates of memory cells in unselected memory blocks are configured in electrically floating states.

FIG. 4 also illustrates the interconnections between the memory cells in array 680 and some aspects of the memory device. As shown, global bitlines 634, 638, 642, and 646 are analogous to a global bitline that is to be connected to drain contact 218 illustrated in FIGS. 2 and 3 and are further coupled respectively to sense amplifiers 636, 640, 644, and 648. Each sense amplifier determines whether a selected memory cell is programmed or erased through the absence or presence, respectively, of a current flowing through the corresponding global bitline. Each global bitline in memory array 680 is coupled to one stack in each block. Since only one block of memory is addressed during a read, erase, or program operation, only one stack should be electrically coupled to any global bitline and thus create a current that is detected by a particular sense amplifier.

Biasing configuration 600, as shown in FIG. 4, is configured to determine the programmed or erased state of a selected memory cell such as 604 based on sensing the presence or absence of a read current through global bitline such as 634 by a sense amplifier such as 636. This configuration includes wordline 624 biased to a first voltage ($V_{read}$), SSG 628 and SDG 622 biased at a second voltage ($V_{selectors}$), and wordline 626 biased at a third voltage ($V_{pass}$). Shared source lines 630 and 660 are grounded in this configuration. Consistent with an embodiment, the presence of a current in global bitline 634 corresponds to an erased state in memory cell 604, while the absence of a current in global bitline 634 corresponds to a programmed state in memory cell 604. For example, $V_{read}$ may be about 2V while $V_{pass}$ and $V_{selectors}$ may be about 6V. Also, for example, $V_{read}$ may be greater than about 2V or less than about 2V, while $V_{pass}$ may be greater than about 6V or less than about 6V and $V_{selectors}$ may be greater than 6V or less than about 6V.

As previously described, the voltage differential between the gates of the selectors 204 and 214 and the p-well 202 in embodiments shown in FIGS. 2 and 3 may lead to enough electron tunneling in the selectors to make their threshold voltages unacceptably low positive values, e.g., zero volts, or negative voltages. Negative thresholds in selectors can lead to an inability to correctly read data in the memory array, as explained below. Assume for purposes of explanation that selectors for block 650 have negative thresholds. This condition may affect read operations on memory cells within block 632. During such a read operation, one of the wordlines within block 632 selects a particular memory cell, such as wordline 624 selecting memory cell 604. In this configuration, the presence or absence of a read current through a global bitline should be determined exclusively by the erased or programmed state, respectively, of the selected memory cell in block 632. Yet, the presence of a negative threshold voltage in selectors within stacks of block 650 can electrically couple a second stack to a particular global bitline; i.e., a single stack cannot be addressed. For example, if selectors 662 and 668 had negative thresholds, a read operation on memory cell 604 combined with a bias of 0V on SDG 652 and SSG 658 may allow stack 670 to conduct a current regardless of the state of memory cell 604. For this reason, irrespective of the fact that the selected cell 604 in block 632 has a programmed state, a read operation of that cell 604 would indicate the cell was erased if the corresponding cell in block 650 was erased. Thus, electrically coupling more than one stack to a global bitline represents a cause for an inability to correctly read data from the array.

By contrast, and consistent with an embodiment, if the selectors in block 650 do not have threshold voltages that allow conducting enough current to falsely trigger sense amps to recognize an erased memory cell, memory array 680 functions properly and does not experience an inability to correctly read data. For example, a read operation on cell 604 enables a current through memory stack 610 if memory cell 604 is erased, but precludes such a current through memory stack 610 if memory cell 604 is programmed. Additionally, in this example, the threshold voltages of selectors 662 and 668 prevent stack 670 from conducting a current. Therefore, the presence or absence of a current in global bitline 634 is dependent on the erased or programmed state of cell 604, respectively. Accordingly, an ability to correctly read data is seen in array 680 if only one stack is coupled to a global bitline during a read operation. This can be achieved by managing the threshold voltages of selectors in accordance with another embodiment of the present invention, as discussed next.

Figure 5:
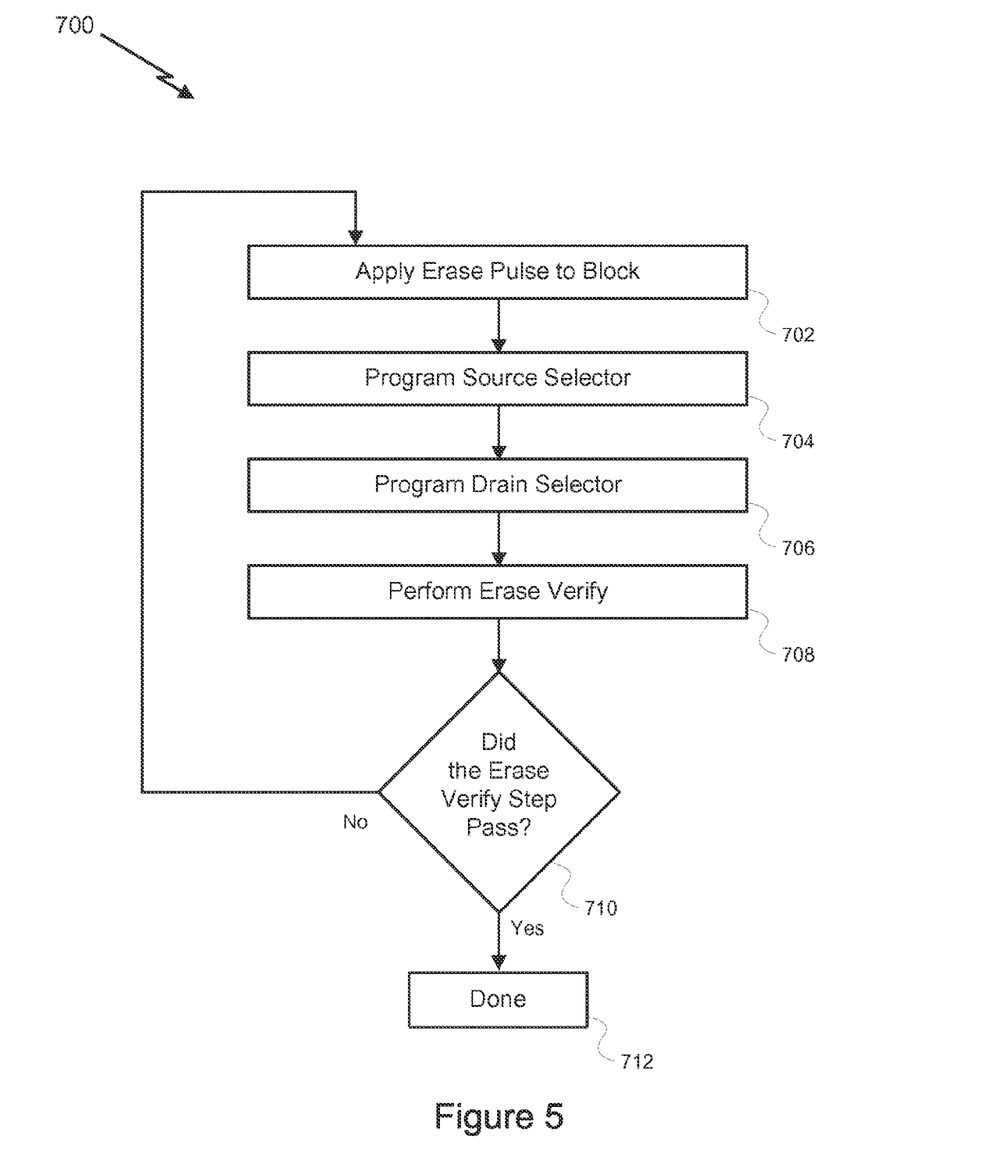
FIG. 5 illustrates a method for offsetting selector device threshold voltages by programming one or more selectors consistent with an embodiment.

FIG. 5 illustrates method 700 for offsetting or managing threshold voltages of selectors by programming one or more selectors consistent with an embodiment. There are at least two types of programming operations: "blind programming" and "selective programming". In blind programming, for example, drain contact 218, source contact 216 and p-well 202 are biased at 0V, 1.8V, and 16V, respectively, and the gate of drain selector 214, the gate of source selector 204 and the gate of each of memory cells 204 to 212 are biased at 15V, 0V, and 9V, respectively. In selective programming, on the other hand, the voltage to be supplied to drain contact 218 depends on data stored in sense amplifiers 636 to 646 after verification step 708, and thus receives a 0V bias when programmed and a 4V bias when not programmed. Further, in selective programming, source contact 216 and p-well 202 are biased at 1.8V and 16 v, respectively, and the gate of drain selector 214, the gate of source selector 204 and the gate of each of memory cells 204 to 212 are biased at 15V, 0V, and 9V, respectively. It should be noted that the voltage values to be supplied to the respective components may be changed or modified to attain suitable programming on drain and/or source selectors.

Drain selector programming may utilize either one of blind programming and selective programming. Source selector programming utilizes blind programming. Blind programming of selectors involves applying a program pulse to the gates of selectors without verifying that the selectors were programmed. During blind programming, a program operation is achieved for each stack in the block by biasing the gate of a selector to be programmed at a high voltage and grounding its channel. Additionally, source selectors within a block are programmed in a separate step from drain selectors within a block being programmed. Unlike selective programming, blind programming allows for source selectors to be programmed either before drain selectors are programmed or after drain selectors are programmed; i.e., selector programming for blind programming is not order-dependent.

Selective programming of selectors in a block involves using blind programming to program all source selectors in the block and then electrically configuring drain selectors within a block whose threshold voltages should be increased. For drain selector programming, the selectors whose threshold voltage should not be increased are electrically configured to avoid an elevated electrical field across gates oxide, thereby avoiding programming of such selectors. Configuring drain selectors to avoid elevated electrical field across the sidewall insulating film relies on source selectors with positive threshold voltages. Thus, selective programming involves programming the source selectors prior to programming the drain selectors.

As shown, method 700 begins with step 702, which applies an erase pulse to a block of FLASH memory undergoing an erase operation consistent with the biasing configuration shown in FIG. 2 or 3. Prior to step 702, one or more memory cells may have threshold voltages corresponding to erased memory cells. Application of an erase pulse may reduce the threshold voltages of the source and drain selectors, as discussed above.

Step 704 is therefore performed to program the source selectors of the block that is undergoing an erase operation. As discussed above, regardless of whether blind or selective programming is employed to program drain selectors, blind programming is employed to program source selectors. Additionally, as discussed above, the source selectors are programmed prior to the drain selectors being programmed if selective programming is employed for drain selectors. The effect of this programming step is to increase the threshold voltage of at least one source selector from that of an erased memory cell to that of a programmed memory cell (but less than the pass biasapplied during a read operation). The goal of source selector programming is to ensure that all source selector thresholds are positive voltages to allow correctly reading data from the block, as described in conjunction with FIG. 4.

Step 706 is then performed to program the drain selectors of the block that is undergoing an erase operation. As discussed above, either blind programming or selective programming may be employed to program the drain selectors in a block. However, source selectors should be programmed prior to drain selectors programmed if selective programming is employed for drain selectors. The effect of this programming step is to increase the threshold voltage of at least one drain selector from a negative voltage to a positive voltage (but less than the pass biasapplied during a read operation). The goal of drain selector programming is to ensure that all drain selector thresholds are positive voltages to allow correctly reading data from the block, as described conjunction with in FIG. 4. For embodiments employing blind programming of drain selectors in step 706, step 704 may either be performed before or after step 706. For embodiments employing selective programming of drain selectors in step 706, however, step 704 is performed prior to step 706.

Step 708 performs an erase verify operation on the memory cells within the block. This operation verifies that all memory cells within the selected block have threshold voltages corresponding to erased memory cells. In step 710, a determination is made whether every memory cell in the selected block verified as being erased during step 708. As previously discussed in conjunction with FIG. 4, the distinction between an erased or programmed memory cell is determined by the presence or absence, respectively, of a current through the memory cell. If step 710 determines that every cell verified as erased in step 708, the method terminates in step 712. Otherwise, the method returns to step 702. Thus, in summary, method 700 performs a program operation on source and drain selector devices to offset low or negative thresholds, as a type of parasitic effect, that might otherwise lead to an inability to correctly read data in the array. This reduction in or elimination of parasitic effects can allow for control of the threshold voltage of memory cells independent of the corresponding cells' use as memory elements or dummy cells. Additionally, cycling endurance of the memory device may improve. Yet, other embodiments exist for managing the threshold voltages of selector devices, as discussed below.

The foregoing discussion outlines the nature and causes of parasitic effects seen in modern NAND FLASH memory devices. The foregoing discussion also describes numerous embodiments that alone or in combination may be applied to reduce or avoid the parasitic effects described herein. Persons of ordinary skill in the art will recognize that variations of the described embodiments will be readily apparent without departing from the spirit and scope of the claimed invention.

Other embodiments will be apparent to persons of ordinary skill in the art from consideration of the specification and practice of the embodiments disclosed herein. The recitations in the claims are to be interpreted broadly based on the language employed in the claims and not limited to examples described in the present specification or during the prosecution of the application, which examples are to be construed non-exclusive. Further, the steps of the disclosed methods may be modified in any manner, including by reordering steps and/or inserting or deleting steps. It is intended, therefore, that the specification and examples be considered as exemplary only, with a true scope and spirit being indicated by the following claims and their full scope equivalents.

What is claimed is:

1. A method comprising performing an erase operation on a memory stack that includes first and second selector transistors and a plurality of memory cell transistors connected in series between the first and second selector transistors, the memory cell transistors including a first memory transistor adjacent to the first selector transistor and a second memory cell transistor adjacent to the second selector transistor, the performing the erase operation comprising:
applying a bias voltage to a gate of each of the first and second selector transistors to release the gate of each of the first and second selector transistors from an electrically floating condition;
applying an erase voltage to a gate of each of the first and second memory transistors,
applying an additional erase voltage to a semiconductor region in which the memory cell transistors are formed; and
after applying the bias voltage, the erase voltage, and the additional erase voltage respectively to the gate of each of the first and second selector transistors, the gate of each of the first and second memory transistors, and the semiconductor region, programming each of the first and second selector transistors.

2. The method of claim 1, wherein the bias voltage and the erase voltage are different from each other.

3. The method of claim 1, wherein the bias voltage is greater than the erase voltage, and the erase voltage is applied to memory cell transistors other than the first and second memory transistors.

4. The method of claim 1, wherein the bias voltage is greater than the erase voltage, and the performing the erase operation further comprises applying an another additional erase voltage to a gate of a third memory cell transistor that is adjacent to the first memory cell transistor and to a gate of a fourth memory cell transistor that is adjacent to the second memory cell transistor, the another additional erase voltage being smaller than the erase voltage.

5. The method of claim 4, wherein the another additional erase voltage is applied to a gate of each remaining memory cell transistor that intervenes between the third and the fourth memory cell transistors.

6. The method of claim 4, wherein the performing the erase operation further comprises applying a further additional erase voltage to a gate for each remaining memory cell transistor that are located between the third and the fourth memory cell transistor, the further additional erase voltage being smaller than the another additional erase voltage.

7. The method of claim 1, wherein the first selector transistor is coupled between a bit line and the first memory cell transistor,
wherein the second selector transistor is coupled between a source line and the second memory cell transistor, and
wherein the programming comprises:
programming the second selector transistor, after programming the first selector transistor.

8. The method of claim 7, wherein the performing the erase operation comprising:
after verifying whether erasure of the memory cell transistors has succeeded, applying again the bias voltage, the erase voltage, and the additional erase voltage respectively to the gate of the first and second selector transistors, the gate of each of the first and second memory transistors, and the semiconductor region.

9. The method of claim 1, wherein the first selector transistor is coupled between a bit line and the first memory cell transistor,
wherein the second selector transistor is coupled between a source line and the second memory cell transistor, and
wherein the programming comprises:
programming the first selector transistor, after programming the second selector transistor.

10. The method of claim 1, wherein the performing the erase operation comprising:
verifying whether erasure of the memory cell transistors has succeeded.

11. A method comprising:
applying first, second, and third voltages to a NAND memory stack, the NAND memory stack comprising first and second selector transistors and a plurality of memory cell transistors that are formed in a semiconductor region, the memory cell transistors being between the first and second selector transistors and including a first memory cell transistor located on a side of the first selector transistor and a second memory cell transistor located on a side of the second selector transistor;
applying the first voltage to the semiconductor region;
applying the second voltage to a gate of each of the first and second selector transistors to release the gate of each of the first and second selector transistors from an electrically floating condition;
applying the third voltage to a gate of the first and second memory cell transistors,
wherein a potential difference between the first and second voltages is less than a potential difference between the first and third voltages; and
programming each of the first and second selector transistors after applying the first, second, and third voltages to the NAND memory stack.

12. The method of claim 11, wherein the NAND memory stack is connected to a bit line on a side of the first selector transistor and to a common source line on a side of the second selector transistor, and the programming comprises programming the first selector transistor, followed by programming the second selector transistor.

13. The method of claim 11, wherein the NAND memory stack is connected to a bit line on a side of the first selector transistor and to a common source line on a side of the second selector transistor, and the programming comprises programming the second selector transistor, followed by programming the first selector transistor.

14. The method of claim 11, wherein the third voltage is applied to a gate of each memory cell transistor in the stack other than the first and second memory cell transistors.

15. The method of claim 11, further comprising applying a fourth voltage to a gate of each memory cell transistor in the stack other than the first and second memory cell transistors.

16. A method comprising performing an erase operation on a NAND memory stack, the NAND memory stack including first and second selector transistors and a plurality of memory cell transistors being between the first and second selector transistors, each of the first and second selector transistors and the memory transistors being substantially similar in gate structure, the performing the erase operation comprises a sequence of first and second operations;
- the first operation comprising applying a set of voltages to the NAND memory stack,
- the second operation comprising programming each of the first and second selector transistors, and
- wherein the applying the set of voltages to the NAND memory stack comprises applying a first voltage to a gate of each of the first and second selector transistors to release the gate of each of the first and second selector transistors from an electrically floating condition and applying a second voltage to a gate of a first memory cell transistor on a side of the first selector transistor and to a gate of a second memory cell transistor on a side of the second selector transistor.

17. The method of claim 16, wherein the performing the erase operation further comprises third and fourth operations; the third operation comprising verifying whether erasure of the memory cell transistors has succeeded, and the fourth operation comprising repeating the first and second operations.

18. The method of claim 16, wherein the applying the set of voltages to the NAND memory stack further comprises applying a third voltage to a semiconductor region in which the first and second selector transistors and the memory cell transistors are formed, a potential difference between the first and third voltages being less than a potential difference between the second and third voltages.

19. The method as claimed in claim 16, wherein the NAND memory stack is connected to a bit line on a side of the first selector transistor and to a common source line on a side of the second selector transistor, each of the first and second selector transistors possessing a threshold voltage that is greater than the threshold voltages of the memory cell transistors that have been erased by the erase operation.

20. The method of claim 16, wherein the performing the erase operation further comprises third and fourth operations, the third operation comprising verifying whether erasure of the memory cell transistors succeeded, and the fourth operation comprising repeating the first and second operations.

* * * * *